United States Patent
Tseng et al.

(10) Patent No.: US 9,472,645 B1
(45) Date of Patent: Oct. 18, 2016

(54) DUAL CONTROL GATE SPACER STRUCTURE FOR EMBEDDED FLASH MEMORY

(71) Applicant: Taiwan Semiconductor Manufacturing Co., Ltd., Hsin-Chu (TW)

(72) Inventors: Yuan-Tai Tseng, Zhubei (TW); Chang-Ming Wu, New Taipei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/733,011

(22) Filed: Jun. 8, 2015

(51) Int. Cl.
| | |
|---|---|
| H01L 29/72 | (2006.01) |
| H01L 29/66 | (2006.01) |
| H01L 29/792 | (2006.01) |
| H01L 27/115 | (2006.01) |
| H01L 29/423 | (2006.01) |
| H01L 29/51 | (2006.01) |

(52) U.S. Cl.
CPC ....... *H01L 29/6656* (2013.01); *H01L 27/1157* (2013.01); *H01L 29/42344* (2013.01); *H01L 29/518* (2013.01); *H01L 29/66833* (2013.01); *H01L 29/792* (2013.01)

(58) Field of Classification Search
CPC ........... H01L 29/6656; H01L 27/1157; H01L 29/42344; H01L 29/518; H01L 29/66833; H01L 29/792; H01L 21/28273
See application file for complete search history.

(56) References Cited

U.S. PATENT DOCUMENTS

| | | | | | |
|---|---|---|---|---|---|
| 5,969,383 | A * | 10/1999 | Chang | ............... | H01L 21/28282 257/316 |
| 6,335,554 | B1 * | 1/2002 | Yoshikawa | ......... | G11C 11/5671 257/316 |
| 8,298,900 | B2 * | 10/2012 | Hayashi | ............ | H01L 21/28282 257/314 |
| 9,117,702 | B2 * | 8/2015 | Charpin-Nicolle | | H01L 21/28282 |
| 2006/0079053 | A1 * | 4/2006 | Chen | ................. | H01L 21/28114 438/261 |
| 2007/0228498 | A1 * | 10/2007 | Toba | ................. | H01L 21/28282 257/411 |
| 2008/0227254 | A1 * | 9/2008 | Rao | .................... | H01L 21/28273 438/261 |
| 2009/0224306 | A1 * | 9/2009 | Hayashi | ............ | H01L 21/28282 257/316 |
| 2010/0200909 | A1 * | 8/2010 | Kawashima | ...... | H01L 21/28282 257/326 |
| 2011/0300699 | A1 * | 12/2011 | Molas | ............... | H01L 21/28282 438/586 |
| 2012/0139025 | A1 * | 6/2012 | Gely | .................. | G11C 16/0433 257/316 |
| 2014/0252445 | A1 * | 9/2014 | Chen | ................. | H01L 21/28273 257/316 |

\* cited by examiner

*Primary Examiner* — Yosef Gebreyesus
(74) *Attorney, Agent, or Firm* — Eschweiler & Associates, LLC

(57) ABSTRACT

The present disclosure relates to a split gate flash memory cell. In some embodiments, the split gate flash memory cell has a select gate separated from a semiconductor substrate by a gate dielectric layer. A control gate is arranged at one side of the select gate. A charge trapping layer has a vertical portion disposed between the select gate and the control gate, and a lateral portion extending under the control gate. A first control gate spacer is arranged on the lateral portion of the charge trapping layer and extends continuously along an outer sidewall of the control gate. A second control gate spacer is arranged on the lateral portion of the charge trapping layer and extends along an outer sidewall of the first control gate spacer. Bottom surfaces of the first and second control gate spacers are substantially co-planar with a bottom surface of the control gate.

20 Claims, 9 Drawing Sheets

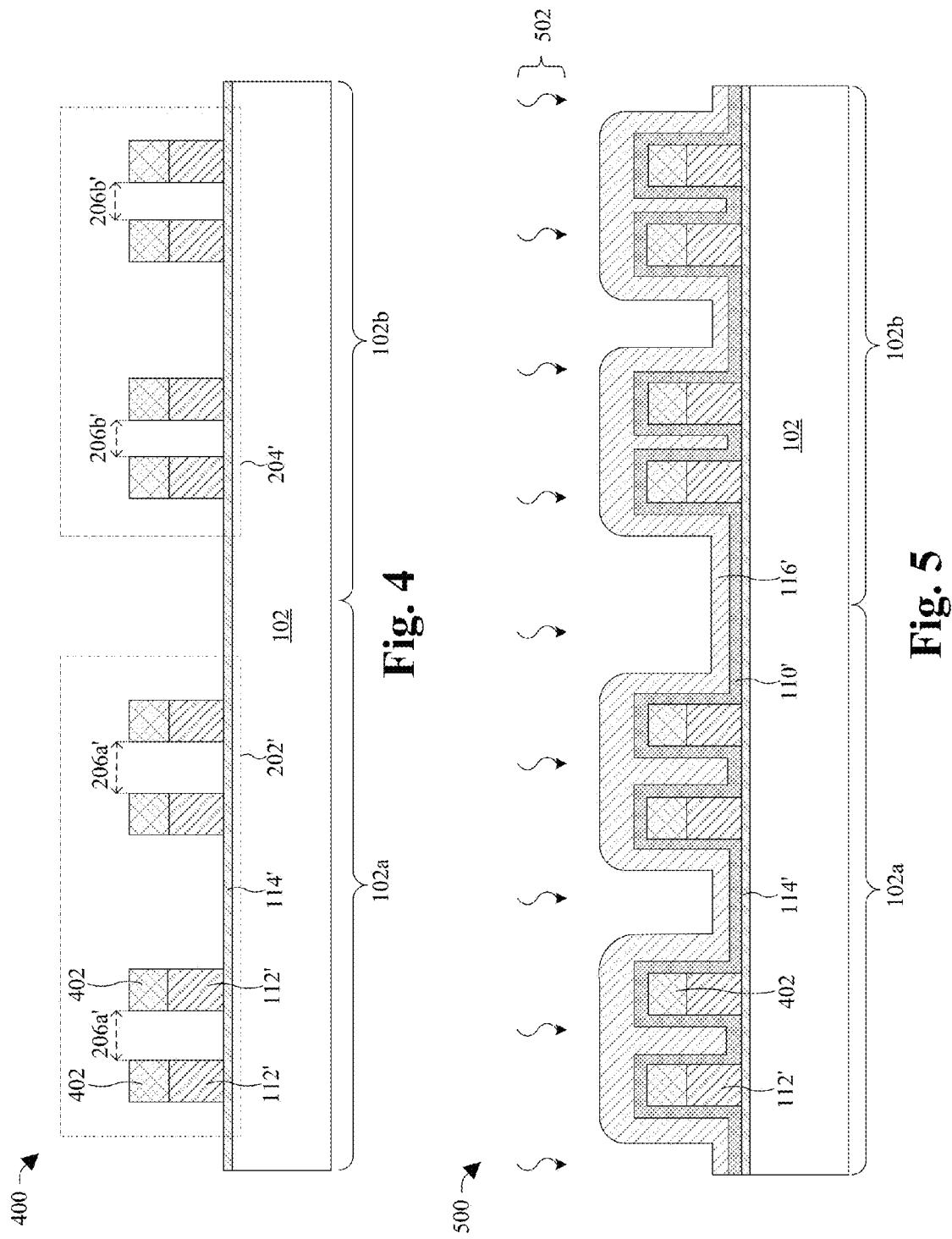

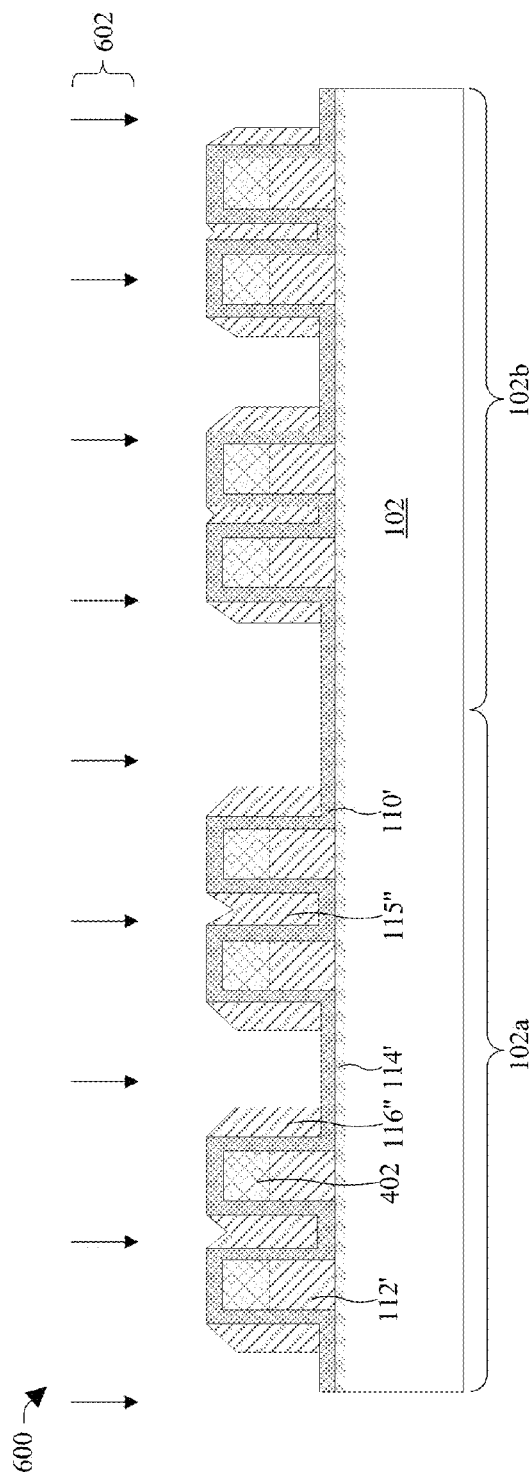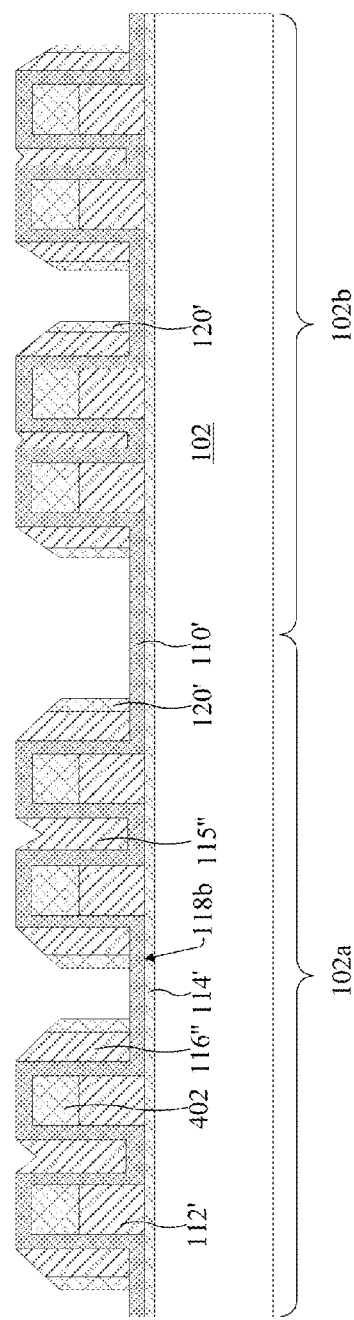

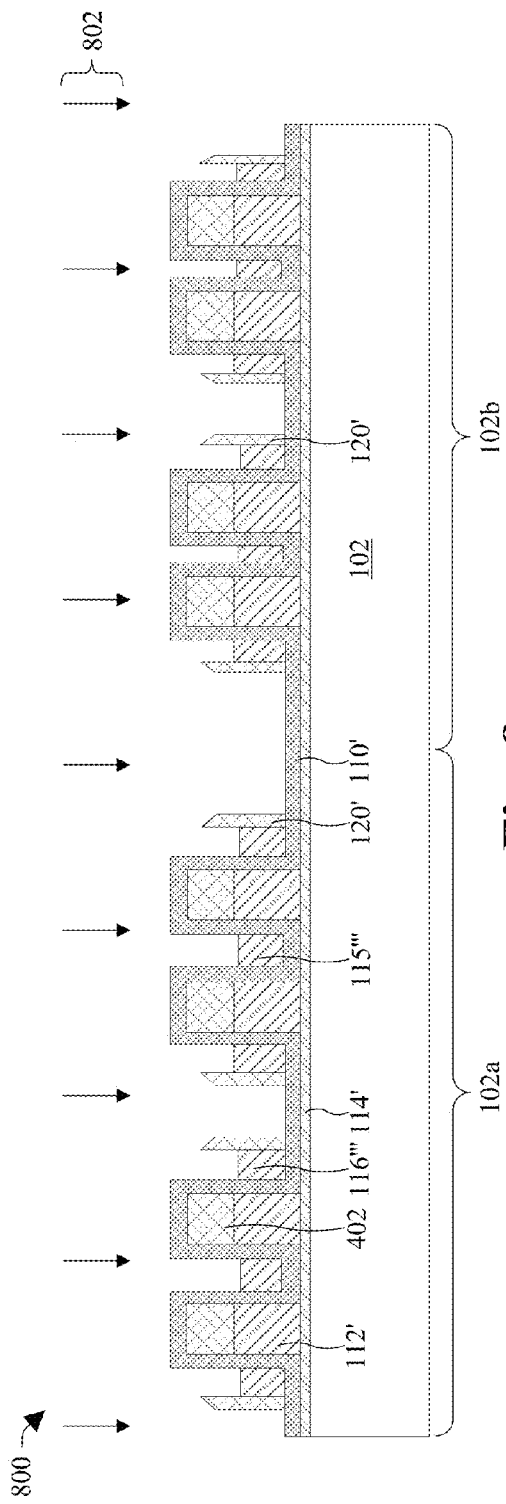
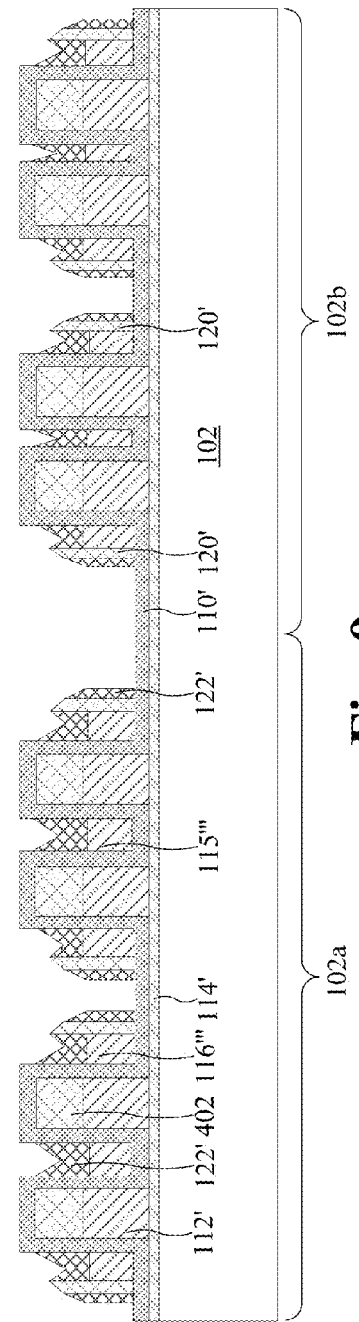

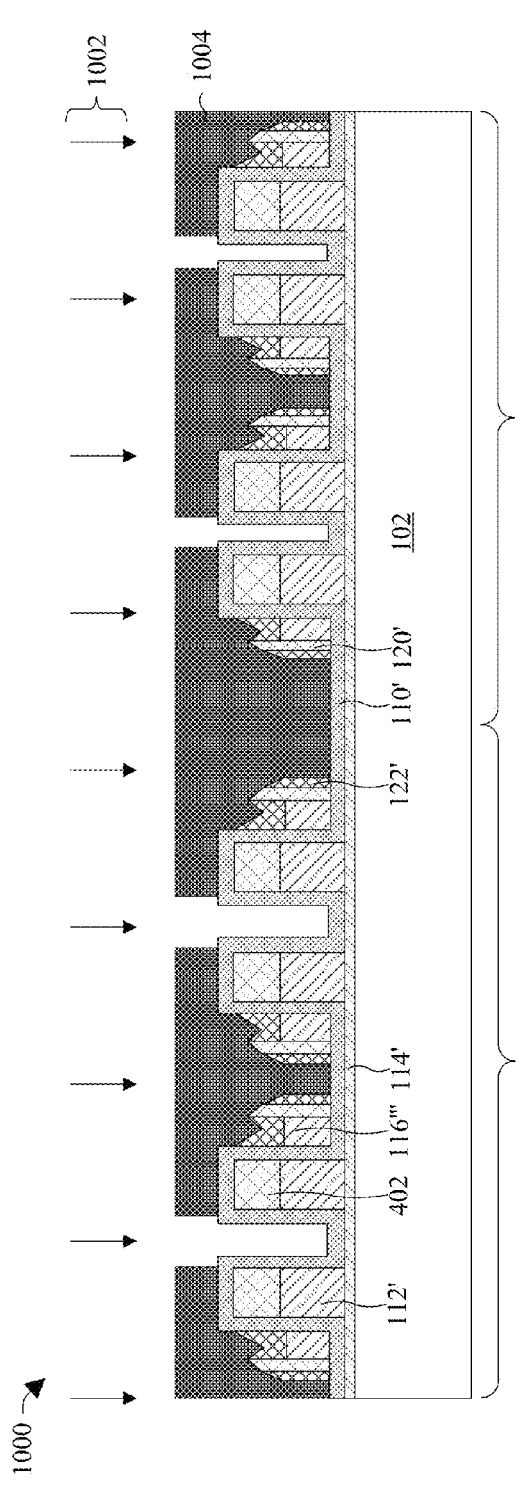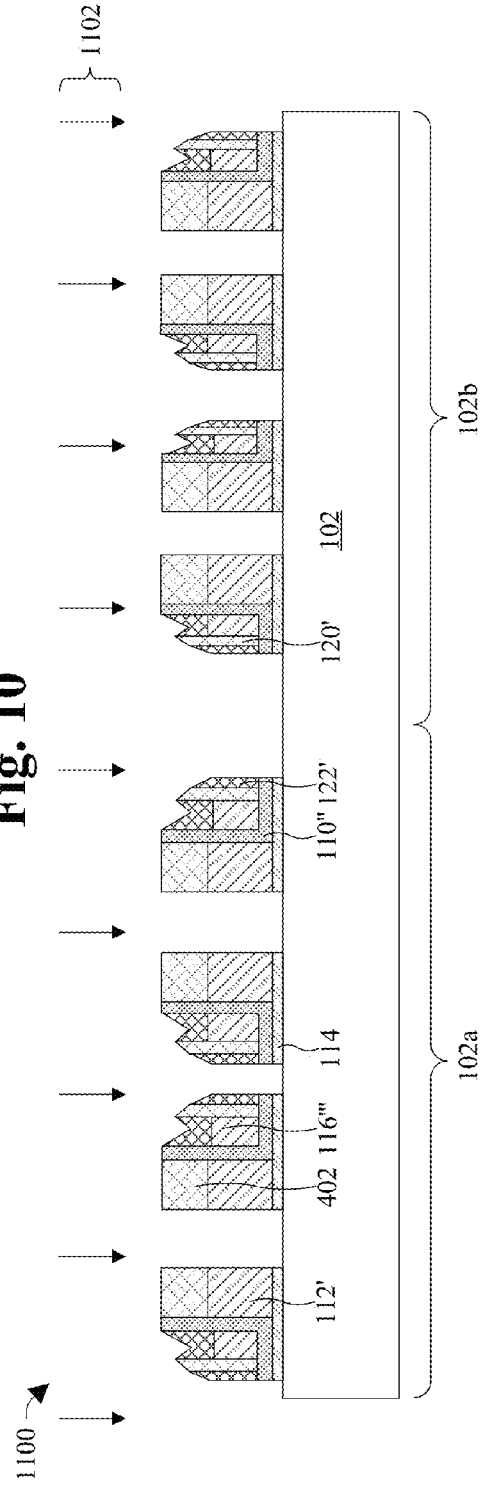

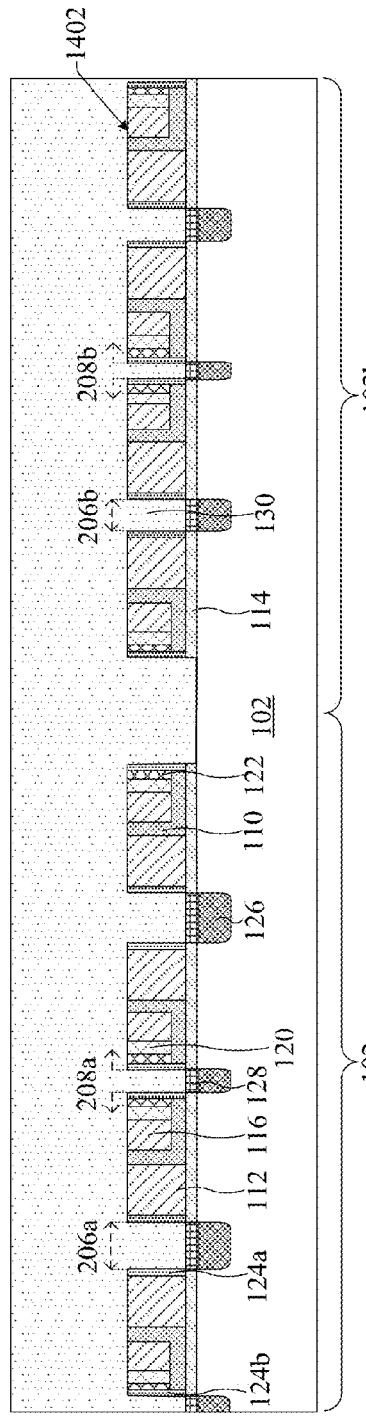
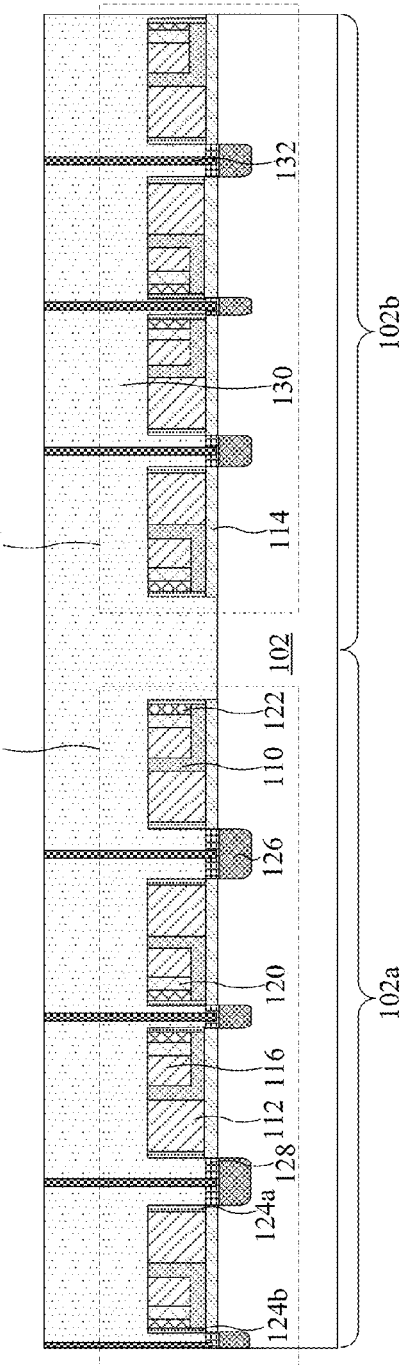
Fig. 14
Fig. 15

DUAL CONTROL GATE SPACER STRUCTURE FOR EMBEDDED FLASH MEMORY

BACKGROUND

Flash memory is an electronic non-volatile computer storage medium that can be electrically erased and reprogrammed quickly. It is used in a wide variety of electronic devices and equipment. To store information, flash memory includes an addressable array of memory cells having charge storage components. Common types of flash memory cells include stacked gate memory cells and split gate memory cells. Compared to stacked gate memory cells, split gate memory cells have higher injection efficiency, less susceptibility to short channel effects, and better over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4-15 illustrate some embodiments of cross-sectional views at various stages of manufacture, of a method of forming split gate flash memory cells.

DETAILED DESCRIPTION

Figures 1A, 1B:
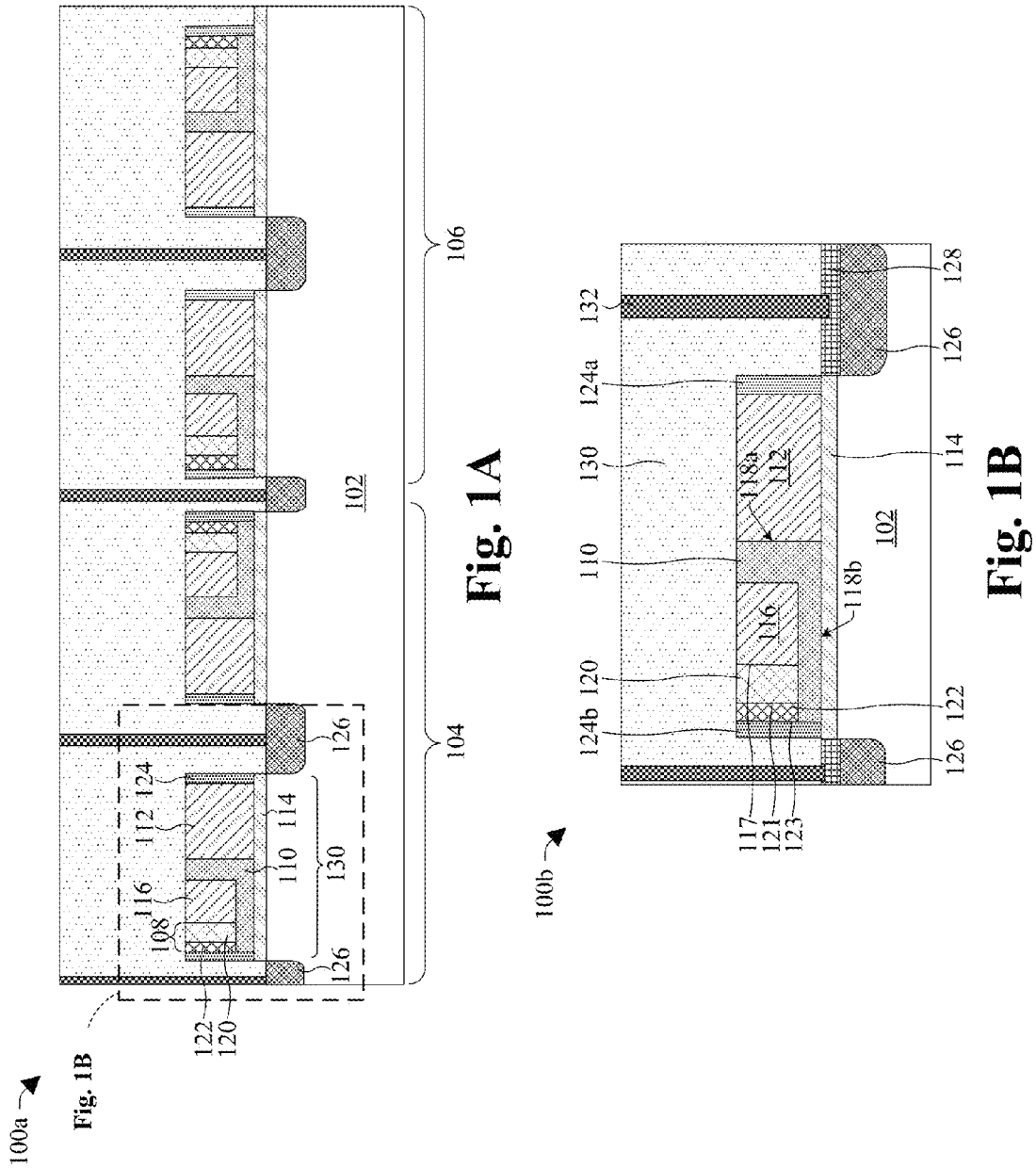
FIG. 1A illustrates a cross-sectional view of two pairs of split gate flash memory cells, according to some embodiments of the present disclosure.
FIG. 1B illustrates a cross-sectional view of some embodiments of a split gate flash memory cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Split gate flash memories typically include an array of split gate memory cells which store data bits. A split gate memory cell includes a select gate (SG) and a control gate (CG) disposed over a channel region located within a semiconductor substrate. The SG and CG are laterally separated by a charge trapping layer configured to trap predetermined amounts of charge corresponding to data bits stored in the memory cell. Conventionally, to fabricate the CGs of a flash memory cell a conductive control gate material is deposited over SGs and a dielectric material is deposited over the control gate material. The control gate material and the dielectric material are patterned in a single etching step to form a CG precursor and a dielectric spacer extending along an upper portion of the CG precursor. A BARC (bottom anti-reflective coating) coating is formed along a sidewall of the CG precursor below the dielectric spacer in order to protect an exposed sidewall of the CG precursor (residing below the dielectric spacer) from a subsequent etching process that recesses an upper surface of the CG precursor to form the control gate.

Unfortunately, non-uniformity of the BARC coating may be an issue with such processes. For example, different arrays of split gate flash memory cells may have different spacings between flash memory cells. The different spacings make it difficult to achieve a uniform thickness of BARC coating over the different arrays of split gate flash memory cells (e.g., flash memory cells separated by a smaller spacing will have a greater overlying BARC coating thickness than flash memory cells separated by a larger spacing). Such non-uniformity of the BARC coating will cause residue of the BARC coating to remain after it is stripped. The residue negatively affects subsequent processing steps and leads to incomplete CG recessing and CG damage.

Accordingly, the present disclosure relates to an improved structure for a split gate flash memory cell, and an associated processing method. The processing method forms a dielectric spacer that extends along a full length of a sidewall of a CG precursor, thereby providing protection to the sidewall of the CG precursor without using a BARC coating. In some embodiments, the resulting split gate flash memory cell comprises a select gate separated from a semiconductor substrate by a gate dielectric layer. A control gate is arranged at one side of the select gate and a charge trapping layer having a vertical portion is disposed between the select gate and the control gate. The charge trapping layer has a lateral portion extending under the control gate. A first control gate spacer is arranged on the lateral portion of the charge trapping layer and extends continuously along an outer sidewall of the control gate. A second control gate spacer is arranged on the lateral portion of the charge trapping layer and extends along an outer sidewall of the first control gate spacer. Bottom surfaces of the first and second control gate spacers are substantially co-planar with a bottom surface of the control gate. Advantageously, the split gate flash memory cell does not suffer from non-uniform BARC coating issues as previous processes, and thus provides for improved reliability.

FIG. 1A illustrates a cross-sectional view of some embodiments of an integrated circuit 100a comprising split gate memory cells.

The integrated circuit 100a comprises a first pair of split gate flash memory cells 104 and a second pair of split gate flash memory cells 106 arranged over a semiconductor substrate 102. The first and second pairs of split gate flash memory cells, 104 and 106, have split gate flash memory cells respectively comprising a select gate 112 and a control gate 116 disposed over a channel region 130 extending between a source/drain regions 126 within the semiconductor substrate 102. The select gate 112 is separated from the semiconductor substrate 102 by a gate dielectric layer 114. The control gate 116 is vertically separate from the semiconductor substrate 102 by the gate dielectric layer 114 and by a charge trapping layer 110. The control gate 116 is laterally separated from the select gate 112 by the charge trapping layer 110.

Dual sidewall spacers 108 are arranged over the charge trapping layer 110. The dual sidewall spacers 108 have bottom surfaces that are substantially coplanar with a bottom surface of the control gate 116. In some embodiments, the dual sidewall spacer 108 comprises a first control gate spacer 120 and a second control gate spacer 122. The first control gate spacer 120 is arranged on the charge trapping layer 110 and extends along an outer sidewall of the control gate 116. The second control gate spacer 122 is arranged on the charge trapping layer 110 and extends along an outer sidewall of the first control gate spacer 120. Sidewall spacers 124 may be disposed over the gate dielectric layer 114 and abut the select gate 112 (opposite to charge trapping layer 110) and the charge trapping layer 110 and the second control gate spacer 122.

Since the first control gate spacer 120 extends along an entire length of a sidewall of the control gate 116, the first control gate spacer 120 is able to protect the sidewall of the control gate 116 from etching processes used to recess an upper surface of the control gate 116 during fabrication of the integrated circuit 100a (without using a BARC coating). FIG. 1B illustrates a cross-sectional view of a more detailed embodiment of a split gate flash memory cell 100b.

The split gate flash memory cell 100b comprises a select gate (SG) 112 disposed over a semiconductor substrate 102. The SG 112 is separated from the semiconductor substrate 102 by a gate dielectric layer 114. A control gate (CG) 116 is arranged at one side of the SG 112. In some embodiments, the SG 112 and the CG 116 have cuboid shapes with planar top surfaces and sidewalls, which benefit critical dimension control, spacer formation, and leakage control. In some embodiments, the SG 112 and the CG 116 comprise doped polysilicon. In other embodiments, the SG 112 and the CG 116 may comprise other conductive materials such as metal, for example.

A charge trapping layer 110 configured to store charges has a vertical portion 118a and a lateral portion 118b. The vertical portion 118a is disposed between neighboring sidewalls of the SG 112 and the CG 116. The lateral portion 118b extends under the CG 116. In some embodiments, the charge trapping layer 110 comprises a charge trapping component (e.g. a nitride layer or a layer of sphere-like silicon dots randomly arranged) sandwiched between two dielectric layers (e.g. oxide layers). During operation of the split gate flash memory cell 100b, the dielectric layers are structured to promote electron tunneling to and from the charge trapping component, such that the charge trapping component can retain trapped electrons that alter the threshold voltage of the split gate flash memory cell 100b in a manner that corresponds to a data state stored in the split gate flash memory cell 100b.

A first control gate spacer 120 is disposed directly above the lateral portion 118b of the charge trapping layer 110 and extends along an outer sidewall of the CG 116 (opposite to the vertical portion 118a). The first control gate spacer 120 protects sidewalls of the CG 116 during etching processes. In some embodiments, the first control gate spacer 120 may comprise silicon nitride. The first control gate spacer 120 abuts an outer sidewall 117 of the CG 116. In some embodiments, the first control gate spacer 120 and the control gate 116 have a substantially same height, such that the first control gate spacer 120 extends along an entire length of the outer sidewall 117 of the control gate 116.

A second control gate spacer 122 is disposed directly above the lateral portion 118b of the charge trapping layer 110 and extends along an outer sidewall 121 of the first control gate spacer 120 (opposite to CG 116). The second control gate spacer 122 may comprise silicon nitride. The second control gate spacer 122 abuts an outer sidewall 121 of the first control gate spacer 120. In some embodiments, the second control gate spacer 122 and the first control gate spacer 120 have a substantially same height, such that the second control gate spacer 122 extends along an entire length of the outer sidewall 121 of the first control gate spacer 120.

A first sidewall spacer 124a is disposed over the gate dielectric layer 114 along an outer sidewall of the SG 112 (opposite to charge trapping layer 110). A second sidewalls spacer 124b is disposed over the gate dielectric layer 114 and extends along an outer sidewall 123 of the second control gate spacer 122 (opposite to first control gate spacer 120). The second sidewall spacer 124b covers a sidewall of the lateral portion 118b of the charge trapping layer. In some embodiments, the first and second sidewall spacers, 124a and 124b, may comprise silicon nitride. In some embodiments, upper surfaces of the first and second sidewall spacers, 124a and 124b, the first and second control gate spacers, 120 and 122, the vertical portion 118a of the charge trapping layer 110, the CG 116 and the SG 112 are co-planar as a result of a planarization process performed during fabrication of the split gate flash memory cell 100b.

Source/drain regions 126 are disposed within the semiconductor substrate 102 on opposite sides of the first and second sidewall spacers, 124a and 124b. In some embodiments, a source/drain region 126 adjacent to the first sidewall spacer 124a can act as a shared or common drain region for a neighboring split gate flash memory cell (not shown). In some embodiments, a silicide layer 128 can be disposed on a top surface of the source/drain regions 126. An inter-level dielectric (ILD) layer 130 is arranged over the semiconductor substrate 102. Conductive contacts 132 vertically extend through the ILD layer 130 to the silicide layer 128, to provide an electrical connection between the source/drain regions 126 and an overlying metal interconnect layer (not shown).

During operation, the SG 112 is connected to a word line (WL) (not shown) to control the access of the split gate flash memory cell 100b. Charge carriers (e.g., holes or electrons) can be injected to the charge trapping layer 110 through a conductive channel region located between the source/drain regions 126. For example, a low voltage can be applied to the SG 112 to form an inversion channel below the SG 112. While the low voltage is applied to the SG 112, a high voltage is applied to the CG 116, which attracts or repels charge carriers to or from the charge trapping layer 110. The low SG voltage helps to minimize drain current during programming, which leads to a relative small programming power compared to standard one-transistor memories.

Figure 2:
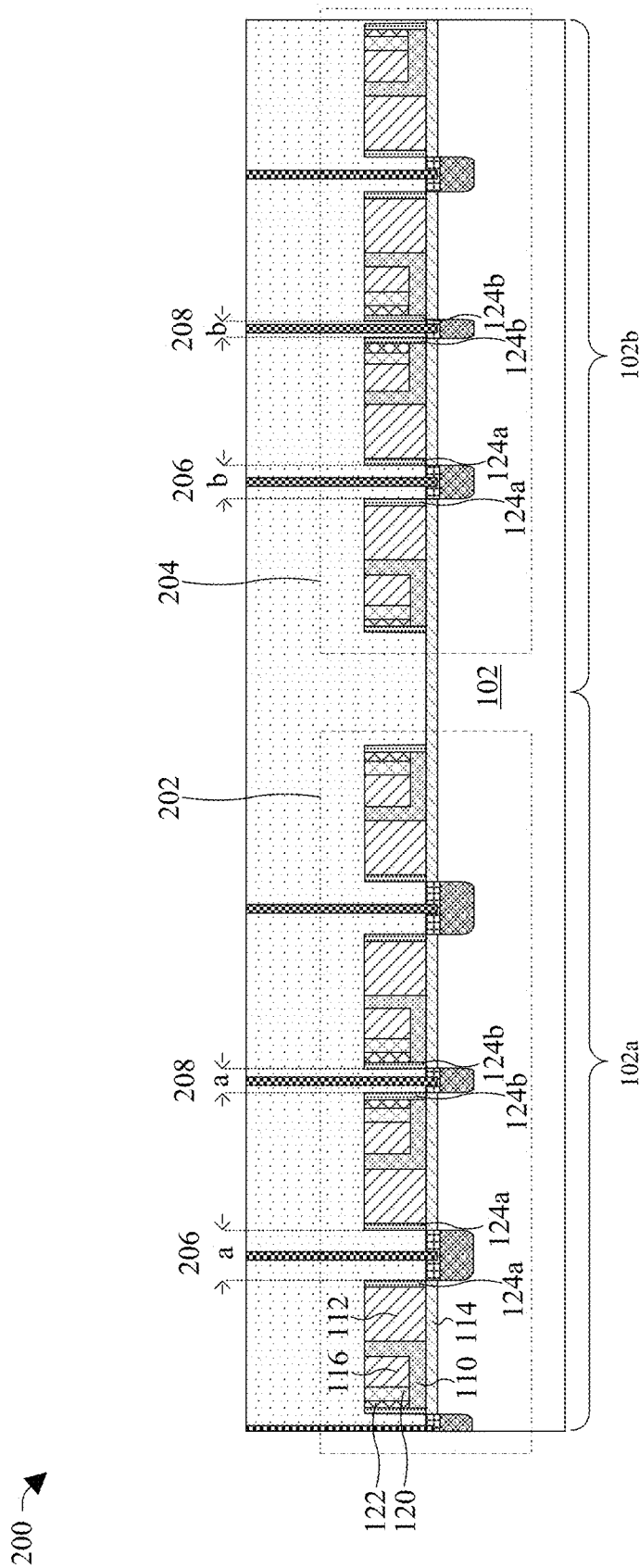
FIG. 2 illustrates a cross-sectional view of some embodiments of two arrays of split gate flash memory cells having different spacing.

FIG. 2 illustrates a cross-sectional view of some embodiments of an integrated circuit (IC) 200 having two arrays of split gate flash memory cells with different spacing.

The semiconductor substrate 102 comprises a first region 102*a* laterally separated from a second region 102*b*. A first array 202 of split gate flash memory cells is disposed over the first region 102*a* and a second array 204 of split gate flash memory cells is disposed over the second region 102*b*. In some embodiments, the first region 102*a* and second region 102*b* may comprise structures that provide different purposes. For example, in some embodiments, the first region 102*a* may comprise a first array 202 of split gate flash memory cells used to store data bits, while the second region 102*b* may comprise a second array 204 of split gate flash memory cells used as capacitors. In some embodiments, where the first array 202 is a flash memory array, the first and second distances 206*a*, 208*a*, ranges between approximately 20 nm and approximately 300 nm. In some embodiments, where the second array 204 acts as a capacitor, the third distance 206*b* ranges between approximately 20 nm and approximately 300 nm, and the fourth distance 208*b* is less than approximately 100 nm.

In some embodiments, different elements of the first and/or second arrays, 202 and/or 204, may be spaced apart differently. For example, in some embodiments, first sidewall spacers 124*a* of the first array 202 are separated by a first distance 206*a* and second sidewall spacers 124*b* of the first array 202 are separated by a second distance 208*a*. Similarly, first sidewall spacer 124*a* of the second array 204 are separated by a third distance 206*b* greater than the first distance 206*a* and second sidewall spacers 124*b* of the second array 204 are separated by a fourth distance 208*b* greater than the second distance 208*a*. A general spacing between memory cells of different arrays may be described as an average of these individual distances. i.e., a first spacing of the first array 202 can be described as an average of the first and second distances, 206*a* and 208*a*, and a second spacing of the second array 204 can be described as an average of the third and fourth distances, 206*b* and 208*b*. In other words, first spacing=(206*a*+208*a*)/2; and second spacing=(206*b*+208*b*)/2. Since the first control gate spacer 120 is used to protect the control gate 116, the problem of non-uniform BARC coating deposition and complete BARC coating removal between arrays having different spacings is eliminated.

Figure 3:
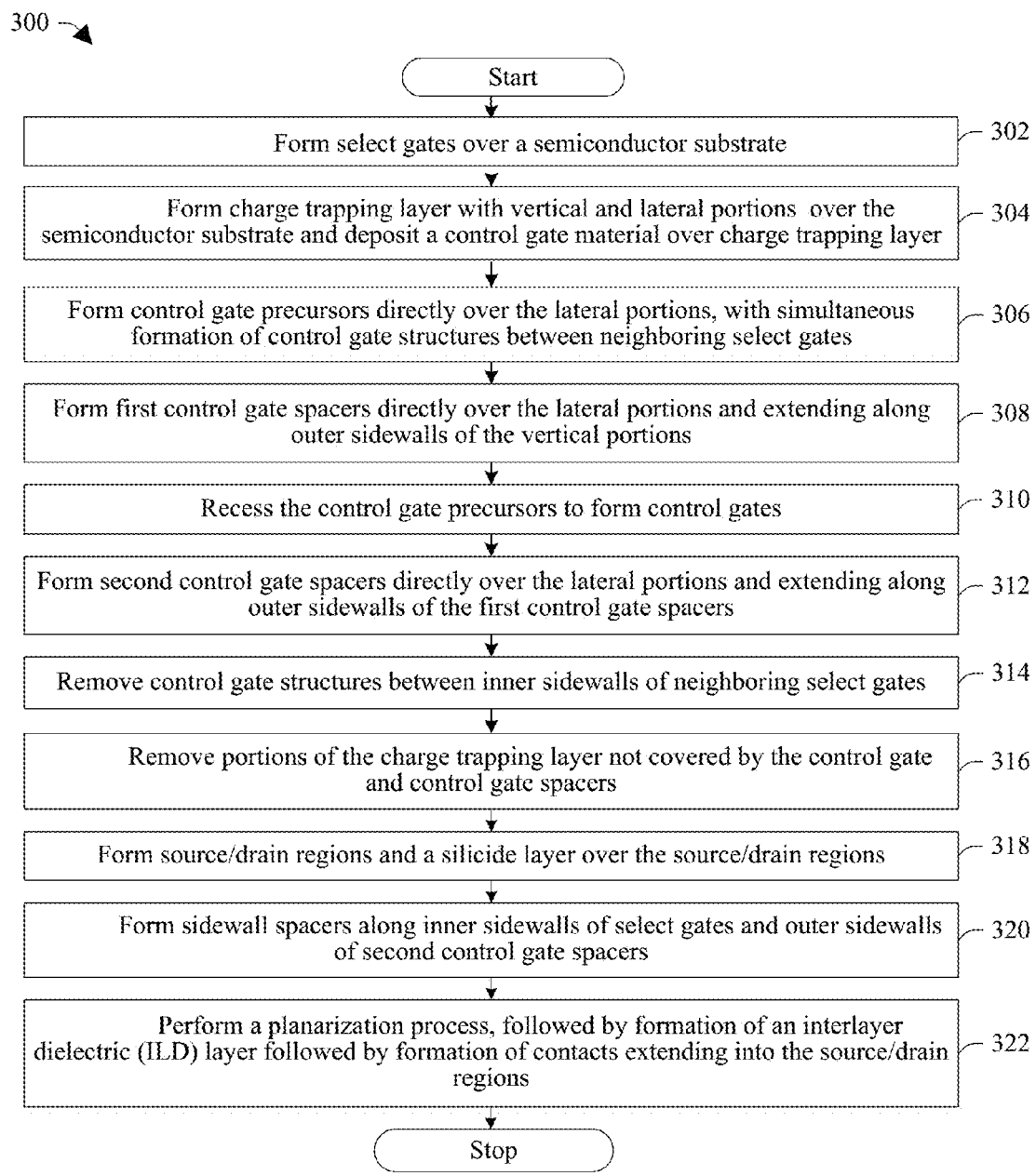
FIG. 3 illustrates a flow diagram of some embodiments of a method of forming pairs of split gate memory cells.

With reference to FIG. 3, a flowchart of some embodiments of a method 300 for manufacturing an integrated circuit is provided. Advantageously, the method 300 does not include a BARC coating process, but rather uses a first control gate spacer to protect sidewalls of control gates during recess of control gate precursors.

At 302, select gates are formed over a semiconductor substrate.

At 304, a charge trapping layer is formed over the semiconductor substrate, the charge trapping layer having vertical and lateral portions. A control gate material is then deposited over the charge trapping layer.

At 306, controls gate precursors are formed directly over the lateral portions of the charge trapping layer, and control gate structures are simultaneously formed between neighboring select gates.

At 308, first control gate spacers are formed directly over the lateral portions of the charge trapping layer. The first control gate spacers extend along outer sidewalls of the vertical portions of the charge trapping layer.

At 310, control gate precursors are recessed to form control gates.

At 312, second control gate spacers are formed directly over the lateral portions of the charge trapping layer. The second control gate spacers extend along outer sidewalls of the first control gate spacers.

At 314, control gate structures between inner sidewalls of the neighboring select gates are removed.

At 316, portions of the charge trapping layer that are not covered by the control gates and control gate spacers are removed.

At 318, source/drain regions are formed, followed by formation of a silicide layer over the source/drain regions.

At 320, sidewall spacers are formed along inner sidewalls of select gates and outer sidewalls of the second control gate spacers.

At 322, a planarization process is performed, followed by formation of an ILD layer. Contacts are then formed to ohmically couple to the source/drain regions.

While the disclosed method 300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 4-15, cross-sectional views of a method of forming a pair of split gate memory cells according to some embodiments are provided. Although FIGS. 4-15 are described in relation to method 300, it will be appreciated that the structures disclosed in FIGS. 4-15 are not limited to such a method.

FIG. 4 illustrates some embodiments of a cross-sectional view 400 corresponding to act 302.

As shown in cross-sectional view 400, a semiconductor substrate 102 is provided having a first region 102*a* and second region 102*b*. A first array of select gates 202' is formed over the first region and a second array of select gates 204' is disposed over the second region. The first and second arrays of select gates 202' and 204' respectively comprise select gates (SG) 112' and corresponding SG masks 402 disposed thereover. A gate dielectric layer 114' can be formed onto the semiconductor substrate 102 prior to the formation of the SG 112'. Neighboring SGs 112' of the first array of select gates 202', which share a common source region, are separated by a first select gate spacing 206*a*', while neighboring SGs 112' of the second array of select gates 204' are separated by a second select gate spacing 206*b*'. In some embodiments, second select gate spacing 206*b*' is smaller than the first select gate spacing 206*a*'.

The semiconductor substrate 102 is typically planar with a uniform thickness. Further, the semiconductor substrate 102 is n-type or p-type, and can, for example, be a silicon wafer, such as a Si bulk wafer or a silicon-on-insulator (SOI) wafer. If present, an SOI substrate comprises an active layer of high quality silicon, which is separated from a handle wafer by a buried oxide layer. The gate dielectric layer 114' can be an oxide, such as silicon dioxide, or a high-k dielectric material. The SG 112' are made of a conductive material, such as doped polysilicon. The SG masks 402 often include nitrogen, and can be silicon nitride in some embodiments.

FIG. 5 illustrates some embodiments of a cross-sectional view 500 corresponding to act 304.

As shown in cross-sectional view 500, a charge trapping layer 110' is formed on exposed surfaces of the SG masks 402, the SG 112', the gate dielectric layer 114' and the semiconductor substrate 102. In some embodiments, the charge trapping layer 110' can be formed by plasma enhanced chemical vapor deposition (PECVD). In one embodiment, the charge trapping layer 110' includes a charge trapping silicon nitride layer sandwiched between two silicon dioxide layers to create a three-layer stack commonly referred to as an "ONO" layer. In other embodiments, the charge trapping layer 110' may include a silicon-rich nitride film or a layer of silicon nanoparticle dots, or any film that includes, but is not limited to, silicon, oxygen, and nitrogen in various stoichiometries.

Following the formation of the charge trapping layer 110', a deposition process 502 is performed, forming a control gate (CG) material 116' over the charge trapping layer 110'. In some embodiments, the control gate material 116' can be, for example, doped polysilicon or metal. The CG material 116' can be formed by deposition techniques such as chemical vapor deposition (CVD) or physical vapor deposition (PVD).

FIG. 6 illustrates some embodiments of a cross-sectional view 600 corresponding to act 306.

As shown in cross-sectional view 600, a first etch 602 is performed on the CG material 116' to form CG precursors 116" along sidewalls of the SG 112'. The CG precursors 116' have a height that monotonically increases towards the charge trapping layer 110'. The first etch also forms a CG structure 115" formed between inner sidewalls (facing each other) of neighboring SGs 112'. In various embodiments, the first etch 602 may be performed using a dry etchant (e.g., an RIE etch, a plasma etch, etc.) or a wet etchant (e.g., hydrofluoric acid).

FIG. 7 illustrates some embodiments of a cross-sectional view 700 corresponding to act 308.

As shown in cross-sectional view 700, first CG spacers 120' are formed directly over lateral portions 118*b* of the charge trapping layer 110'. The first CG spacers 120' are vertically aligned along outer sidewalls (opposite to SG) of CG precursors 116". In some embodiments, the first control gate spacers 120' are formed by depositing a nitride and selectively etching the nitride to form first CG spacers 120'. In some embodiments, the first CG spacers 120' comprise silicon nitride.

FIG. 8 illustrates some embodiments of a cross-sectional view 800 corresponding to act 310.

As shown in cross-sectional view 800, a second etch 802 is performed to recess the control gate precursors 116" and form CGs 116'''. The first control gate spacer 120' protects the sidewalls of CG precursors 116" disposed along outer sidewalls of the SG 112'. In some embodiments, the second etch 802 may be performed using a dry etchant (e.g., an RIE etch, a plasma etch, etc.) or a wet etchant (e.g., hydrofluoric acid). The second etch 802 recesses the control gate precursors to a height level substantially equal to that of the SG 112'. An etchant used in the second etch 802 may be highly-selective to the charge trapping layer 110' and the first control gate spacers 120', so as to not damage the charge trapping layer 110' and the first control gate spacers 120'.

FIG. 9 illustrates some embodiments of a cross-sectional view 900 corresponding to act 312.

As shown in cross-sectional view 900, second CG spacers 122' are formed directly over the lateral portions 118*b* of the charge trapping layer 110'. The second CG spacers 122' extend along outer sidewalls (opposite to CG 116''') of the first CG spacer 120'. The second CG spacers 122' further form a seal over upper surfaces of the CGs 116'''. The second CG spacers 122' protect the CGs 116''' during future etching steps. In some embodiments, the second control gate spacers 122' are formed by depositing a nitride and selectively etching the nitride to form second CG spacers 122'. In some embodiments, the second CG spacers 122' comprise silicon nitride. In some embodiments, bottom surfaces of the first and second CG spacers 122' are substantially co-planar with a bottom surface of the CGs 116'.

FIG. 10 illustrates some embodiments of a cross-sectional view 1000 corresponding to act 314.

As shown in cross-sectional view 1000, a third etch 1002 is performed to remove CG structures 115''' formed between neighboring SG 112'. In some embodiments, the third etch 1002 includes forming a patterned hard mask 1004 over the first and second regions 102*a*, 102*b*, and exposing upper surface of the semiconductor substrate 102, to remove the CG structures 115''' between inner sidewalls of neighboring SGs 112'. In various embodiments, the etchant used in the third etch 1002 may be a dry etchant (e.g., an RIE etch, a plasma etch, etc.) or a wet etchant (e.g., hydrofluoric acid).

FIG. 11 illustrates some embodiments of a cross-sectional view 1100 corresponding to act 316.

As shown in cross-sectional view 1100, a fifth etch 1102 is performed to remove exposed portions of the charge trapping layer 110' (not covered by the CG 116''' and first and second CG spacers 120', 122'). In some embodiments, the fifth etch 1102 may be performed using a dry etchant (e.g., an RIE etch, a plasma etch, etc.) or a wet etchant (e.g., hydrofluoric acid).

Figure 12:
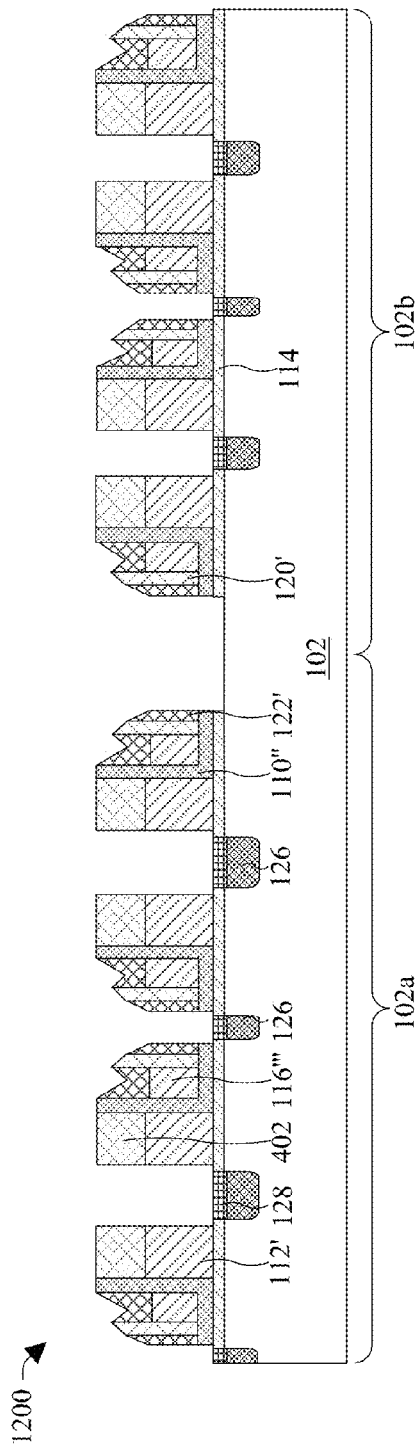

FIG. 12 illustrates some embodiments of a cross-sectional view 1200 corresponding to act 318.

As shown in cross-sectional view 1200, source/drain regions 126 are formed between neighboring SG 112' as well as between CGs 116'. In some embodiments, one or more dopant species (e.g., boron, phosphorous, etc.) are subsequently implanted into unmasked regions of the semiconductor substrate 102 to form the source/drain regions 126. A silicide layer 128 is also formed directly over an upper surface of the source/drain regions 126. The silicide layer 128 provides ohmic coupling between the source/drain regions 126 and contacts formed over it later on.

Figure 13:
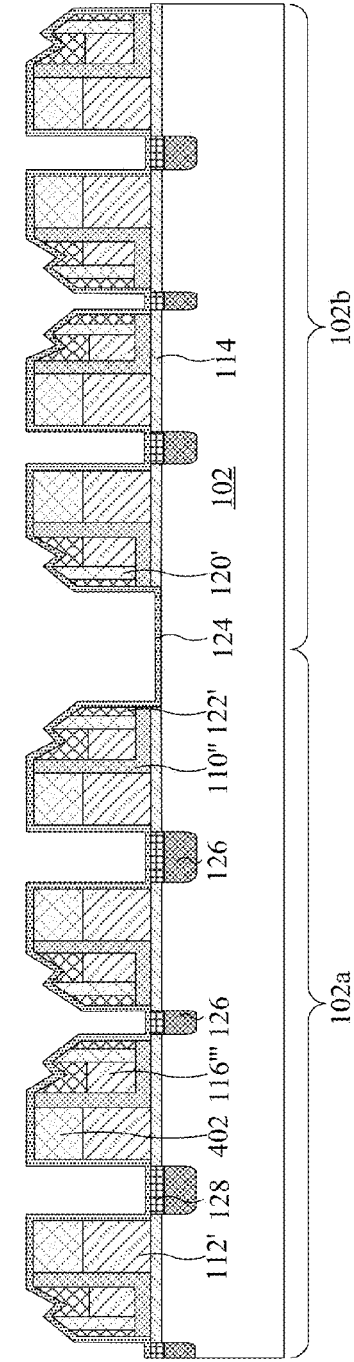

FIG. 13 illustrates some embodiments of a cross-sectional view 1300 corresponding to act 320.

As shown in cross-sectional view 1300, a sidewall spacer material 124 is formed over the semiconductor substrate 102 along exposed surfaces of the CGs 116', the first and second CG spacers, 120' and 122', the SG masks 402 and the SG 112'. The sidewall spacer material 124 abuts outer sidewalls of the inner sidewalls (facing each other) of the SG 112', top surfaces of the silicide layer 128, outer sidewalls and tilted or tapered top surfaces of the second CG spacer 122', upper surfaces of the first CG spacer 120', and upper surface and exposed sidewall of the SG mask 402. In some embodiments, the sidewall spacer material 124 can be silicon nitride.

FIG. 14 illustrates some embodiments of a cross-sectional view 1400 corresponding to acts 320 and 322.

As shown in cross-sectional view 1400, the sidewall spacer material 124 is etched to form first sidewall spacers 124*a* extending along inner sidewalls of the SG 112' and second sidewall spacers 124*b* extending along outer sidewalls of the second control gate spacers 122'. A planarization process is also performed subsequently, to form SG 112, CG 116, charge trapping layer 110, first control gate spacers 120' and second control gate spacer 122, that have upper surfaces planarized along a horizontal plane 1402. An interlayer dielectric (ILD) layer 130, for example a low-k material, is formed to fill spaces over the silicide layer 128 and cover the workpiece.

FIG. 15 illustrates some embodiments of a cross-sectional view 1500 corresponding to act 322.

As shown in cross-sectional view 1500, contacts 132 are formed through the ILD layer 130, extending to the source/drain regions 126. In some embodiments, the contacts 132 comprise a metal, such as copper, gold, or tungsten. In some embodiments, the contacts 132 are formed by performing a patterned etch to create openings in the ILD layer 130, followed by filling the openings with a metal.

Thus, the present disclosure relates to a method that forms a split gate flash memory cell without a BARC coating, and an associated structure.

In some embodiment, the present disclosure relates to a split gate flash memory cell, comprising a select gate separated from a semiconductor substrate by a gate dielectric layer. A control gate is arranged at one side of the select gate. A charge trapping layer having a vertical portion is disposed between the select gate and the control gate, and a lateral portion of the charge trapping layer extends under the control gate. A first control gate spacer is arranged on the lateral portion of the charge trapping layer and extends continuously along an outer sidewall of the control gate. A second control gate spacer is arranged on the lateral portion of the charge trapping layer and extends along an outer sidewall of the first control gate spacer. Bottom surfaces of the first and second control gate spacers are substantially co-planar with a bottom surface of the control gate.

In another embodiment, the present disclosure relates to an integrated circuit (IC). The IC comprises a select gate separated from a semiconductor substrate by a gate dielectric layer. A charge trapping layer having a vertical portion is disposed between the select gate and a control gate, and a lateral portion of the charge trapping layer is disposed between the control gate and the gate dielectric layer. A first control gate spacer abuts the lateral portion of the charge trapping layer and covers a sidewall of the control gate opposing the vertical portion of the charge trapping layer. A second control gate spacer abuts the lateral portion of the charge trapping layer and the first control gate spacer.

In yet another embodiment, the present disclosure relates to a method of forming a split gate memory cell. The method comprises, forming select gates over a semiconductor substrate. The method further comprises forming a charge trapping layer over the semiconductor substrate, the charge trapping layer having vertical portions and lateral portions, wherein the vertical portions abut outer sidewalls of the select gates. The method further comprises forming control gates directly over the lateral portions, wherein the control gates extend along outer sidewalls of the vertical portions. The method further comprises forming first control gate spacers directly over the lateral portions, the first control gate spacers extending along outer sidewalls of the control gates. The method further comprises forming second control gate spacers directly over the lateral portions, the second control gate spacers extending along outer sidewalls of the first control gate spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A split gate flash memory cell, comprising:
    a select gate separated from a semiconductor substrate by a gate dielectric layer;
    a control gate arranged at one side of the select gate;
    a charge trapping layer having a vertical portion disposed between the select gate and the control gate, and a lateral portion extending under the control gate;
    a first control gate spacer arranged on the lateral portion of the charge trapping layer and extending continuously along an outer sidewall of the control gate; and
    a second control gate spacer arranged on the lateral portion of the charge trapping layer and extending along an outer sidewall of the first control gate spacer, wherein bottom surfaces of the first and second control gate spacers are substantially co-planar with a bottom surface of the control gate.

2. The split gate memory cell of claim 1, wherein the first and second control gate spacers comprise silicon nitride (SiN).

3. The split gate memory cell of claim 1, further comprising:
    a first sidewall spacer abutting an inner sidewall of the select gate opposing the charge trapping layer and a second sidewall spacer abutting an outer sidewall of the second control gate spacer.

4. The split gate memory cell of claim 3, wherein the lateral portion of the charge trapping layer has a sidewall aligned with the outer sidewall of the second control gate spacer and covered by the second sidewall spacer.

5. The split gate memory cell of claim 3, wherein upper surfaces of the first and second sidewall spacers, the first and second control gate spacers, the control gate, and the charge trapping layer are co-planar with an upper surface of the select gate.

6. The split gate memory cell of claim 3, wherein the first and second sidewall spacers abut the gate dielectric layer.

7. The split gate memory cell of claim 3, wherein the first sidewall spacer completely separates the second sidewall spacer from the control gate.

8. The split gate memory cell of claim 3, wherein the control gate has a substantially vertical sidewall abutting the first sidewall spacer.

9. The split gate memory cell of claim 1, further comprising:
    source/drain regions disposed in the semiconductor substrate at opposite sides of the select gate and the control gate.

10. An integrated circuit (IC), comprising:
    a select gate separated from a semiconductor substrate by a gate dielectric layer;
    a charge trapping layer having a vertical portion disposed between the select gate and a control gate, and a lateral portion disposed between the control gate and the gate dielectric layer;
    a first control gate spacer abutting the lateral portion of the charge trapping layer and covering a sidewall of the control gate opposing the vertical portion of the charge trapping layer; and
    a second control gate spacer abutting the lateral portion of the charge trapping layer and the first control gate spacer.

11. The IC of claim 10, further comprising:
a first pair of select gates arranged over a first region of the semiconductor substrate and separated by a first distance;
a second pair of select gates separated by a second distance and arranged over a second region of the semiconductor substrate that is laterally separated from the first region of the semiconductor substrate; and
wherein the first pair of select gates and the second pair of select gates respectively abut an additional charge trapping layer having a vertical portion disposed between neighboring sidewalls of one select gate of the first or second pair of select gates and an additional control gate and a lateral portion abutting the additional control gate, an additional first control gate spacer and an additional second control gate spacer.

12. The IC of claim 11, wherein the second distance is less than the first distance.

13. The IC of claim 12, wherein the second distance is less than or equal to approximately 100 nm.

14. A method of forming a split gate memory device, the method comprising:
forming select gates over a semiconductor substrate;
forming a charge trapping layer over the semiconductor substrate, the charge trapping layer having vertical portions and lateral portions, wherein the vertical portions abut outer sidewalls of the select gates;
forming control gates directly over the lateral portions, wherein the control gates extend along outer sidewalls of the vertical portions;
forming first control gate spacers directly over the lateral portions, the first control gate spacers extending along outer sidewalls of the control gates; and
forming second control gate spacers directly over the lateral portions, the second control gate spacers extending along outer sidewalls of the first control gate spacers.

15. The method of claim 14, wherein forming the control gates comprises:
forming control gate material onto the charge trapping layer;
etching the control gate material to form control gate precursors abutting an upper surface of the charge trapping layer and a sidewall of the charge trapping layer;
forming the first control gate spacers abutting a sidewall of one of the control gate precursors and the upper surface of the charge trapping layer; and
recessing the control gate material to form the control gates.

16. The method of claim 15 wherein the first control gate spacers are formed prior to recessing the control gate material and the second control gate spacers are formed after recessing the control gate material.

17. The method of claim 15, wherein the control gate precursors have a height that monotonically increases from between the first control gate spacers and the charge trapping layer.

18. The method of claim 14, wherein forming the control gates comprise:
performing a third etch and removing control gate structures between inner sidewalls of select gates that share a common source, subsequent to formation of the second control gate spacers, thereby forming the control gates.

19. The method of claim 14, further comprising:
performing a planarization process that forms a substantially planar surface along upper surfaces of the first control gate spacers, the second control gate spacers, the control gates, and the select gates.

20. The method of claim 14, further comprising:
forming source/drain regions in the semiconductor substrate, wherein the source/drain regions are arranged between the select gates and abutting outer sidewalls of the control gates;
forming a silicide layer directly on an upper surface of the source/drain regions; and
forming contacts extending to the source/drain regions.

* * * * *